United States Patent
Zhao et al.

(10) Patent No.: US 7,143,381 B2
(45) Date of Patent: Nov. 28, 2006

(54) RESONANCE REDUCTION ARRANGEMENTS

(75) Inventors: Cangsang Zhao, Portland, OR (US); Greg Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 573 days.

(21) Appl. No.: 10/331,649

(22) Filed: Dec. 31, 2002

(65) Prior Publication Data

US 2004/0128625 A1   Jul. 1, 2004

(51) Int. Cl.
  *G06F 17/50*    (2006.01)
  *H03K 19/003*   (2006.01)
  *H03K 17/16*    (2006.01)
  *H03K 17/30*    (2006.01)
  *H01L 21/98*    (2006.01)

(52) U.S. Cl. .............................. 716/10; 716/4; 326/33; 326/22; 326/28; 327/380; 327/381; 438/25; 438/26

(58) Field of Classification Search .................. 716/4, 716/10; 326/33, 22, 28; 327/380, 381; 363/50; 323/312; 438/25, 26
See application file for complete search history.

(56) References Cited

U.S. PATENT DOCUMENTS

| | | | | |
|---|---|---|---|---|
| 3,654,615 A | * | 4/1972 | Freitag | 716/9 |
| 4,600,823 A | * | 7/1986 | Hiejima | 219/663 |
| 5,227,964 A | * | 7/1993 | Furuhata | 363/56.1 |
| 5,351,197 A | * | 9/1994 | Upton et al. | 716/10 |
| 5,446,647 A | * | 8/1995 | Ikeda et al. | 363/89 |
| 5,594,635 A | * | 1/1997 | Gegner | 363/124 |
| 6,108,000 A | * | 8/2000 | Bolotski et al. | 345/212 |
| 6,611,130 B1 | * | 8/2003 | Chang | 323/235 |
| 6,781,355 B1 | * | 8/2004 | Gauthier et al. | 323/233 |
| 6,984,965 B1 | * | 1/2006 | Vinciarelli | 323/266 |
| 2002/0191418 A1 | * | 12/2002 | Clayton et al. | 363/17 |
| 2003/0021127 A1 | * | 1/2003 | Loef et al. | 363/17 |
| 2003/0084415 A1 | * | 5/2003 | Sasaki et al. | 716/4 |
| 2004/0076025 A1 | * | 4/2004 | Gauthier et al. | 363/50 |
| 2004/0124715 A1 | | 7/2004 | Huang et al. | |
| 2004/0184289 A1 | * | 9/2004 | Vinciarelli | 363/15 |
| 2005/0093475 A1 | * | 5/2005 | Kuennen et al. | 315/209 R |

FOREIGN PATENT DOCUMENTS

| JP | 02051895 A | * | 2/1990 |
|---|---|---|---|
| JP | 07058619 A | * | 3/1995 |
| JP | 10248183 A | * | 9/1998 |

OTHER PUBLICATIONS

Corman et al., "'Burst' Technology with Feedback-Loop Control for Capacitive Detection and Electrostatic Excitation of Resonant Silicon Sensors", IEEE Transactions on Electron Devices, vol. 47, No. 11, Nov. 2000, pp. 2228-2235.*
Ang, Michael et al., "An on-chip Voltage Regulator using Switched Decoupling Capacitors"., IEEE, Analog Techniques, ISSCC2000, Session 26, pp. 438-439, Feb. 2000.

* cited by examiner

*Primary Examiner*—Phallaka Kik
(74) *Attorney, Agent, or Firm*—Blakely, Sokoloff, Taylor & Zafman LLP

(57) ABSTRACT

Resonance reduction arrangements to reduce the impact of power supply resonance on circuits, comprising a resonance sensor and a charge dumper, wherein upon the detection of the predetermined resonance by the resonance sensor at a circuit location, the charge dumper dumps charges at least one of from and to the circuit location, wherein the charge dumper comprises at least one gating transistor to dump the charges, the at least one gating transistor is directly connected to a first power supply line having a first potential and a second power supply line having a second potential of a different potential than the first potential.

22 Claims, 2 Drawing Sheets

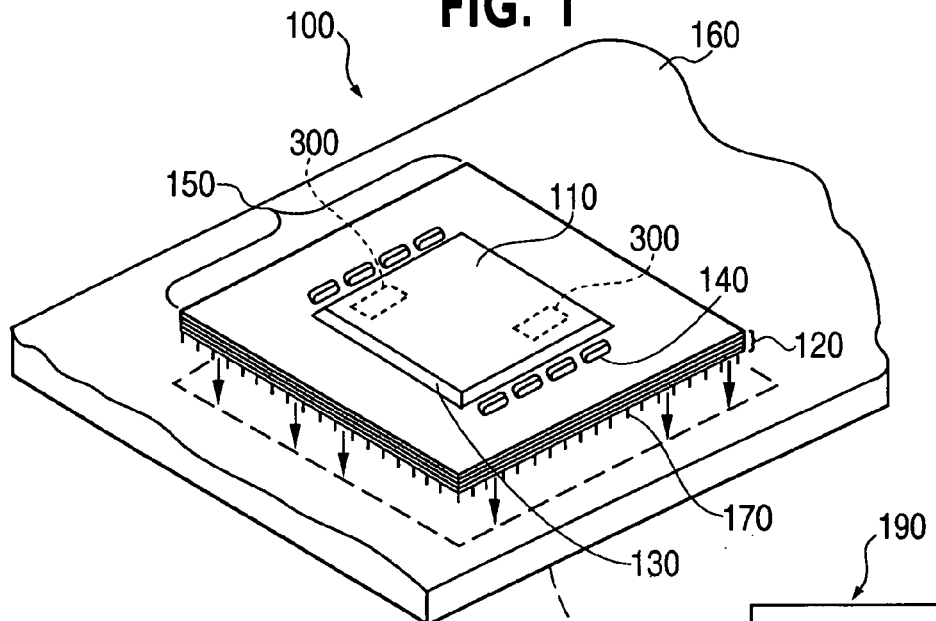
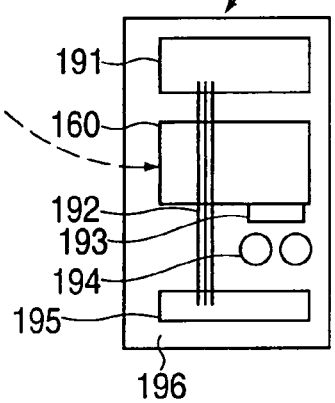
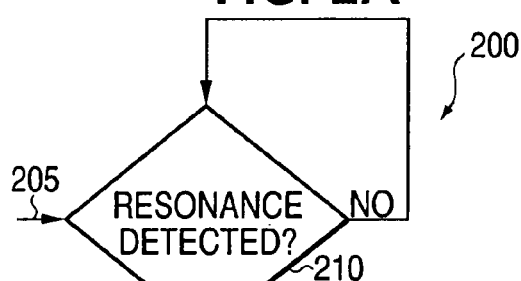
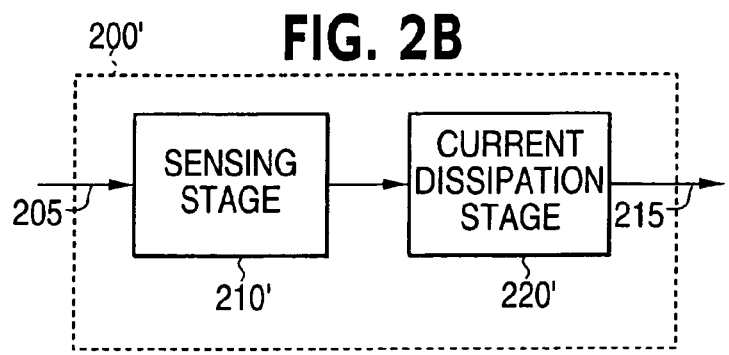

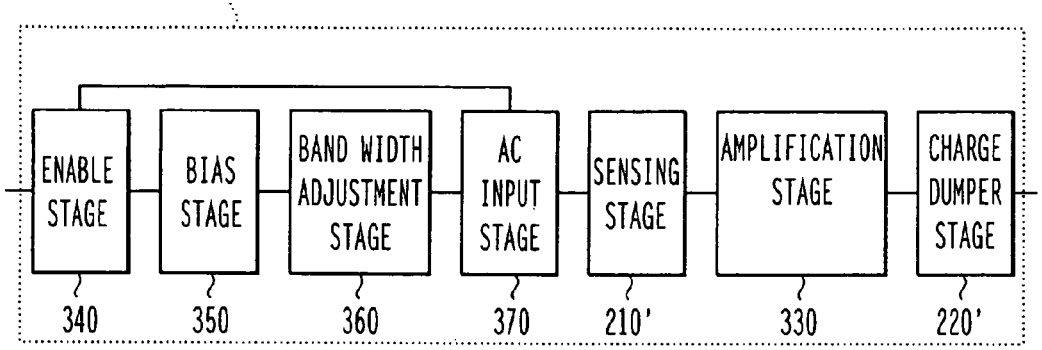
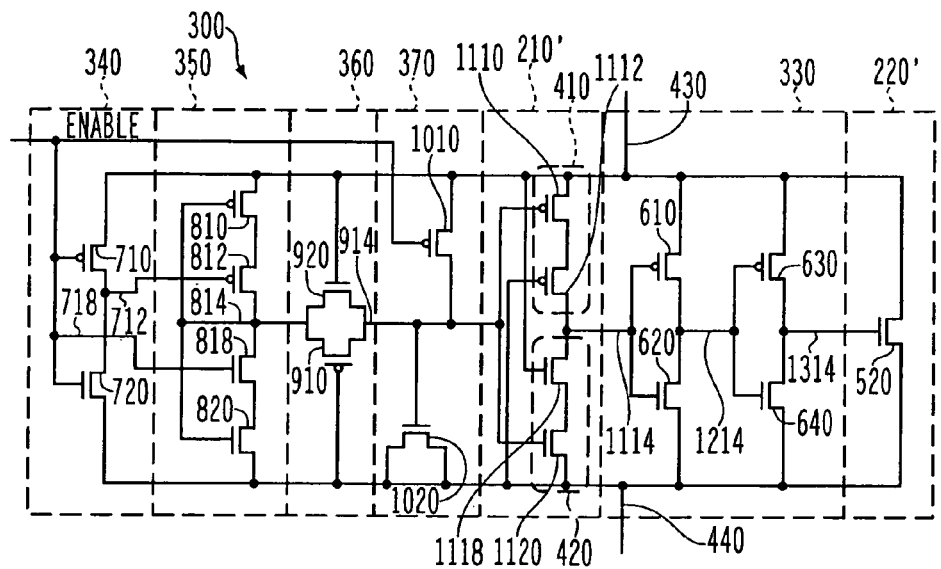
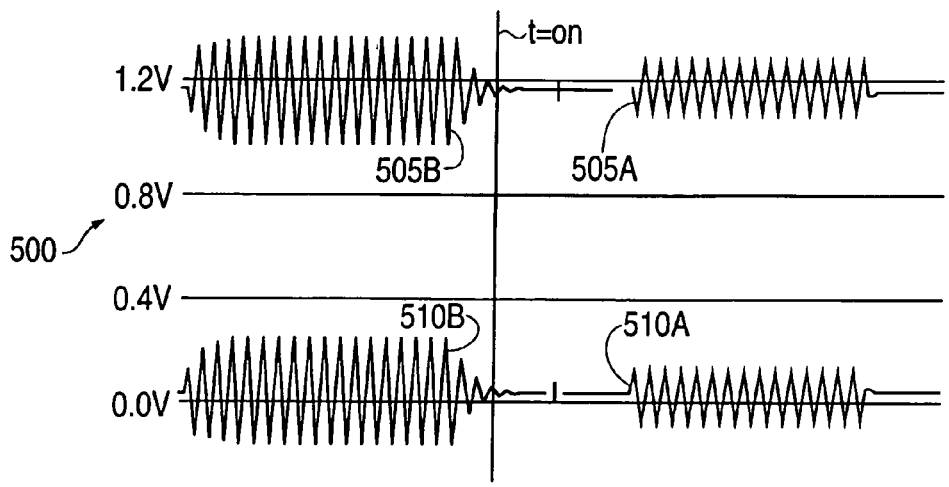

RESONANCE REDUCTION ARRANGEMENTS

FIELD

The present invention relates to resonance reduction arrangements.

BACKGROUND

Electrical arrangements sometimes have resonance that is undesirable in that it may tend to limit efficiency and/or operational capabilities. As one example arrangement, an integrated circuit (IC) processor implemented as part of a processor package will be used to describe background resonance problems as well as example embodiments of the invention. However, practice of embodiments of the present invention is not limited thereto.

Transistors and other components may be inter-coupled on a common IC die to form, for example, a processor IC that may then be mounted on a substrate to form a package that may be subsequently mounted on a printed circuit board or motherboard for further installation in an electronic system. Designers strive to increase operating frequencies (e.g., clocking speeds) of the processor. However, as speed increases, power consumption also tends to increase. It may be difficult to provide and reliably maintain a required power level delivery to a processor IC, especially in contemporary processor systems that allow only a very low noise margin. In short, the effectiveness of the processor (e.g., operating speed) may be a function of the efficient utilization of available power.

Processor operating frequency, in most cases, is increasing at a greater rate than that of package resonant frequency. As one example, in the past decade the package resonant frequency has changed less than an order of magnitude, while processor clock rates have increased over two orders of magnitudes (e.g., 1 MHz to 2 GHz). It has been found that package resonance may disadvantageously reduce an effective available power applied to a processor's components, and consequently, may limit an attainable processor operating speed.

Capabilities of future processors needed to meet marketplace requirements are planned for operation at higher frequencies (e.g., 3, 4, 5. GHz). However the package resonance frequencies (e.g., currently of the order of approximately 50 MHz) may not experience a similar increase. With the package resonance frequencies remaining significantly low in comparison to ever increasing IC frequencies, the opportunities at which a package resonant frequency may be stimulated significantly increases. Needed are apparatus and methods to reduce resonance in IC arrangements.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 1 shows a perspective view of an example integrated circuit (IC) printed circuit board (PCB) carrier package applicable to an electronic system, such view being useful in gaining a more thorough understanding/appreciation of the present invention;

FIG. 2A is a simplistic flowchart illustrating an example method in an example (advantageous) embodiment for reduction of an example package resonance;

FIG. 2B is a simplistic block diagram of an example resonance reduction apparatus;

FIG. 3 illustrates a more detailed block diagram of example stages of an example resonance reduction circuit;

FIG. 4 illustrates a more detailed example circuit of the FIG. 3 example (advantageous) resonance reduction block diagrams, such view being useful in gaining a more thorough understanding/appreciation of the present invention; and FIG. 5 illustrates example voltage waveforms results from resonance reduction with an example embodiment of the present invention, such view being useful in gaining a more thorough understanding/appreciation of the present invention.

DETAILED DESCRIPTION

Before beginning a detailed description of the subject invention, mention of the following is in order. When appropriate, like reference numerals and characters may be used to designate identical, corresponding or similar components in differing figure drawings. Further, in the detailed description to follow, example sizes/values/ranges may be given, although the present invention is not limited to the same. Well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented. Such specifics should be well within purview of one skilled in the art. Where specific details (e.g., circuits, flowcharts) are set forth in order to describe example embodiments of the invention, it should be apparent to one skilled in the art that the invention may be practiced without, or with variation of, these specific details. Finally, it should be apparent that differing combinations of hard-wired circuitry and software instructions may be used to implement or construct embodiments of the present invention, i.e., the present invention is not limited to any specific combination of hardware and software.

Again it is reiterated that while an integrated circuit (IC) processor implemented as part of a processor package will be used to describe example embodiments of the invention, practice of embodiments of the present invention is not limited thereto. That is, the invention may be able to be practiced with non-processor types of ICs, and in non-IC types of environments (e.g., discrete component environments).

Turning now to the detailed description, FIG. 1 shows a perspective view 100 of an example integrated circuit (IC) printed circuit board (PCB) carrier package 150 applicable to an electronic system 190, such view being useful in gaining a more thorough understanding/appreciation of the present invention. More particularly, FIG. 1 illustrates an example die 110 (e.g., flip-chip FC) for mounting on an example substrate 120. The electrical connection and mechanical attachment of the die 110 to the substrate 120 may be facilitated by conductive bumps/balls (not shown) and underfill 130. Additional electrical components may also be present on the substrate 120 such as example die-side capacitors 140. This example grouping of a die 110, substrate 120, and associated electrical components (e.g., die-side capacitors 140) may constitute an example package 150.

The package 150 may be further mounted, with example pins 170, to a PCB (e.g., interposer and/or motherboard) 160 for further incorporation of the PCB 160 into an electronic system 190. The relative size of the die 110 to a substrate 120 may vary e.g., chip-scale packaging reduces the size of the package 150 relative to the size of the die 110. The relative sizing of components (i.e. scaling) is a process by which associated electrical components in the package 150 may be proportionally reduced or scaled with advances in process technology, however, there may be an uncorrelated scaling between the die 110 and the rest of the package 150. Such scaling may have an effect on resonance.

The FIG. 1 electronic system 190 may further include one or more of the following: an output device (e.g., a display, printer) 191, a bus 192, a connector 193 (e.g., a PCB connector, socket), an input device (e.g., buttons, keyboard, mouse, touch-pad) 194, a power supply 195, and a case 196.

Package resonance may be detrimental by causing unwanted, sustained and/or transient oscillations that may result in unacceptable noise and signal distortion. As die (e.g., processor) operating frequencies are increasing appreciably while package resonant frequencies are not, there may be a greater number of die clock cycles per unit package resonant cycle. Thus, there is an increased probability that the die (e.g., processor) may operate in a mode that modulates the package at its resonant frequency.

One static (disadvantageous) solution is that if a package operates at a constant, predictable clock rate, one may be able to anticipate and design around possible resonant trouble spots. However, with a programmable processor that may be programmed to run in a plurality of differing power-saving modes (e.g., hibernate, sleep, etc.), the operational clock rate is more difficult to predict and design around. This may lead to significant resonance occurring at one or more of the varying clock rates, or at some submultiples, depending on a present operational domain.

There are additional differing ways to deal with resonance, and the immediate discussion that follows will first focus on a few disadvantageous approaches as such leads to a greater understanding and appreciation of the present invention. More particularly, to decrease resonance, an example (disadvantageous) circuit arrangement embodiment may increase on-die decoupling capacitance in an attempt to reduce the package resonance amplitude. However, this approach may have a number of disadvantages.

First, in order to effectively limit the package resonance, a significant amount of on-die decoupling capacitance may be required. Such on-die capacitors may consume an unacceptable amount of valuable semiconductor real estate. Further, the resonance of on-chip decoupling capacitance may themselves result in oscillation in the supply voltages.

Another important disadvantage is the amount of leakage current. For a larger, slower processor IC, gate and decoupling capacitor leakage is not much of a concern, but it is a significant concern with faster, smaller processors requiring increased power. If this leakage current is too great, an impractical power source may be required to power the arrangement.

As both power consumption and clocking speeds increase, the switching current at local power nodes may require an increased number of high frequency capacitors to offset the power losses associated with the parasitic board and package inductances near the resonance frequency of the package. Consequently, power consumption may be limited in the disadvantageous decoupling capacitor approach.

As another disadvantageous approach, package resonance may be decreased by increasing a series resistance of the package capacitance so as to increase resistive damping. The increased series resistance on the package capacitance, however, may lead to increased power supply droops. Droops, in turn, may lower the potential maximum frequency, and consequently total processing power. In addition, designation of a minimal acceptable series resistance for package capacitors may be required, and such may be unacceptably costly in terms of design and/or financial costs. If resistive damping is to be used, resistance may be altered by addition of discrete resistors or changes in material composition. However, these may result in unwanted inductance, additional components, and costly implementation requiring new installation methodology (e.g., solder techniques).

As yet another disadvantageous approach, an on-die switched capacitance circuit may be constructed. An example of such approach may be found in the reference of: Michael Ang, Raoul Salem and Alexander Taylor, "An On-Chip Voltage Regulator Using Switched Decoupling Capacitors", in the IEEE International Solid-State Circuits Conference (ISSCC) Dig. Tech. Papers, February 1999, pages 438–439. Such example disadvantageous embodiment, however, may still require significant amounts of capacitance, again with the above-mentioned negative impacts on both available die area and leakage current.

Turning now to discussion of the present invention, example (advantageous) embodiments may reduce resonance by detecting supply resonance, and dumping (i.e., wasting) charges when predetermined resonance is detected. That is, while the above mentioned Ang et al. approach uses switched decoupling capacitors to shift/store charges, example embodiments of the present invention dump (i.e., waste) charges. Dumping may be accomplished, for example, by direct momentary, intermittent and/or periodic shorting of two connection nodes (e.g., Vcc/Vss) to one another so as to neutralize charges. The charges dumped may be detected (excessive) resonance charges occurring upon a monitored node. Thus, example embodiments of the present invention may effect resonance damping by charge dumping.

While this dumping approach may seem counterintuitive to the goal of reducing power consumption, the advantage is a much more simplistic approach requiring minimal (if any) capacitor resources. Further, while there is purposeful wasted power, the end effect is actually more and more reliable power available for IC operational uses.

Since embodiments of the present invention may be constructed mainly using transistors, a real estate needed is very small in comparison to capacitor-based and/or resistor-based resonance-reduction approaches. The small real estate requirement makes it particularly advantageous for IC implementations.

In fact, embodiments of the present invention may be made sufficiently small and low cost so as to fit into many unused areas of prior die designs. Thus, IC implementation of embodiments of the present invention may be had with little or negligible additional IC real estate costs. For sake of simplicity and brevity, FIG. 1 shows (in phantom line form) an example of two resonance reduction arrangements 300 implemented on the die 110. However, it should be understood that a given die may contain hundreds or even thousands of arrangements 300 dispersed across the die, with each providing localized resonance reduction protection. Further, a number and/or locations of the arrangements 300 dispersed across a given die-type may very well change over time as die design is changed, e.g., in the strive toward further perfection of the die design.

As one non-limiting example resonance reduction implementation, ones of the resonance reduction arrangements of the present invention may be positioned to monitor and provide resonance reduction services across power grid connections. That is, a resonance sensor may detect for predetermined resonance across power grid connections, such as Vcc (e.g. collector common voltage) and Vss (e.g., ground). Supply resonance may then be detected with an example N-channel metal-oxide-semiconductor (NMOS) device capacitor. Upon detection of a predetermined resonance (e.g., above a maximum allowable threshold), a current dumper arrangement may open at least one gating transistor to dump (i.e., bleed) charges from a first power grid connection (Vcc) to a second power grid connection (Vss) of a differing potential than the first power grid connection. As one example, an example embodiment may remove charges by dissipating current through a current source NMOS. Bleeding off of charges prevents and/or counters (i.e., damps) any resonance from building to further unacceptable levels.

As one example of a predetermined resonance, when Vcc-Vss is detected as being larger than an average Vcc-Vss, an example (advantageous) embodiment may dump a charge away from Vcc. Alternatively, charges may be returned to Vcc (e.g., from a node with a higher potential than Vcc) when detecting less charges or energy in the power system, e.g., when Vcc-Vss is smaller than the averaged Vcc-Vss. Separate resonance reduction circuits may be required to effect each of the aforementioned charge dumping and returning operations.

FIG. 2A is a simplistic flowchart illustrating an example method 200 in an example (advantageous) embodiment for the reduction of an example package resonance. FIG. 2B is a simplistic block diagram of an example resonance reduction apparatus 200' to implement the example sequence of FIG. 2A. At blocks 210, 210', resonance is repeatedly detected (no branch of block 210) for a node signal 205, and upon detection of a predetermined resonance (yes branch of block 210), charges are dumped 215 at blocks 220, 220'. Again, both blocks (or stages) may be implemented on-die, and also may, as one non-limiting example, be coupled to monitor and bleed charges across an on-die Vcc connection and an on-die Vss (e.g., ground) connection.

FIG. 3 is a block diagram of an example multi-stage resonance reduction circuit 300, incorporating both the FIG. 2B example sensing block 210' and charge dumper (i.e., dissipation) block 220' as ones of the stages. The FIG. 3 example may further include other example stages, e.g., an amplification stage 330, an enable stage 340, a bias stage 350, a bandwidth adjustment stage 360, and an AC input stage 370. Such stages may be electrically coupled between Vcc and Vss. Such example resonance reduction circuit 300 may result in a package requiring minimal capacitance and minimal area, and having minimal leakage current.

Of course, practice of embodiments of the present invention is by no means limited to the FIG. 3 example arrangement, i.e., alternative and/or differing combinations of stages may be provided together with the sensing stage 210' and charge dumper stage 220'. In addition, ones of the stages may have alternative and/or supplemental electrical connections with other components or signals not shown in FIG. 3.

FIG. 4 illustrates a more detailed example circuit of the FIG. 3 example (advantageous) resonance reduction blocks, such view being useful in gaining a more thorough understanding/appreciation of the present invention. That is, FIG. 4 illustrates electrical connection of components to a potential of example Vcc 430 and a lower potential Vss 440. Example stages will now be described in further detail, proceeding from the left-to-right direction in FIG. 4.

More particularly, an example enable stage 340 may contain one or more of enable stage p-type transistors 710 and enable stage n-type transistors 720 that may be electrically coupled between Vcc 430 and Vss 440, and that may receive an ENABLE signal on the gate inputs thereof. The example enable stage 340 an inverter, has the ability to make both polarities of the ENABLE signal i.e. active high and active low available to the other stages of the circuit. For example, FIG. 4. illustrates an ENABLE signal fed forward to the bias stage 350, via nodes 712 and 718. When the ENABLE signal is high, the circuit is active e.g., reducing the effects of power supply resonance. When the ENABLE signal is low, circuit stages that can draw DC current (i.e. bias nodes to voltages other than Vcc or Vss) are disabled. In particular, transistors 812 and 818 are turned OFF and transistor 1010 is turned ON.

While the example enable stage shows direct control of two or three stages, practice of embodiments of the present invention is by no means limited thereto, i.e., a fewer or greater number of stages may be controllably enabled/disabled. Further, any viable type of enable stage may be used.

In advancing a block rightward, bias stage 350 may include one or more of bias stage p-type transistors 810, 812 and bias stage n-type transistors 818, 820 electrically coupled between Vcc 430 and Vss 440. This bias stage has the ability to generate a voltage that biases the sensing stage 210' close to its DC trip point. In order to accomplish this, transistor devices 810 and 820 should be sized appropriately with respect to sensing stage 210' transistor devices 1110 and 1120. In the FIG. 4 example embodiment, the ratio of device sizes 810/820 should be larger (e.g., 5% more, 10% more, etc.) than a ratio of device sizes 1110/1120, assuming that substantially identical length devices are used. This results in the bias stage generating a voltage $V_{bias}$ that is somewhat below the sensing stage threshold determined by devices 1110 and 1120. Devices 812 and 818 are present so that the bias stage can be disabled. Devices 1112 and 1118 are present in the sensing stage to match the impact of devices 812 and 818 on the bias stage.

In an example embodiment, the width of the bias stage p-type transistors 810, 812 may be greater than the width of the sensing stage n-type transistors 818, 820 (e.g., twice the width, three times the width, etc.). As one non-limiting example, the transistors 810, 812 may each have a width/length of 0.66/0.12 microns, while the transistors 818, 820 may each have a width/length of 0.22/0.12 microns. The transistors 812, 818 control activation of the bias stage 350 via the feed forwarding of signals on nodes 712, 718, respectively. A biasing signal on node 814 is fed forward to the bandwidth adjustment stage 360. While the example bias stage shows a specific example arrangement, practice of embodiments of the present invention is by no means limited thereto, and any viable type of bias stage may be used.

Bandwidth adjustment stage 360 may include one or more bandwidth adjustment stage p-type transistor(s) 910 and one or more bandwidth adjustment stage n-type transistor(s) 920 coupled in parallel and electrically coupled between Vcc 430 and Vss 440. A bandwidth adjustment signal on node 914 is fed forward to the AC input stage 370. The bandwidth adjustment stage has the ability to set the low frequency bound of the circuit. This frequency can be set as the product of a resistance formed by the sum of the bias stage and the bandwidth adjustment stage times the capacitance on node 914 (the sum of the sense capacitance 1020 and any device capacitances on this node). In an example embodiment, this low frequency bound should be below the package resonant frequency yet high enough so that the circuit does not respond to low frequency fluctuations that it cannot alleviate (e.g. temperature changes).

In an example embodiment, the bandwidth adjustment stage p-type transistor 910 and bandwidth adjustment stage n-type transistor 920 may both have long channels, and further, the width of the bandwidth adjustment stage p-type transistor 910 may be greater than the width of the bandwidth adjustment stage n-type transistors 920 (e.g., twice the width, three times the width, etc.). As one non-limiting example, the transistor 910 may have a width/length of 0.44/0.8 microns, while the transistor 920 may have a width/length of 0.22/0.8 microns.

While the example bandwidth adjustment stage shows a specific example arrangement, practice of embodiments of the present invention is by no means limited thereto, and any viable type of bandwidth adjustment stage may be used. This stage could also be implemented as a resistor instead of a CMOS pass gate. In alternate embodiments, such a bandwidth adjustment stage may not be needed, and be omitted.

Alternating current (AC) input stage 370 may contain one or more AC input stage p-type transistors 1010 (controlled by the ENABLE signal as discussed previously) and one or more AC input stage n-type transistors 1020 electrically coupled between Vcc 430 and Vss 440. The example AC input stage has the ability to couple noise from the one of the power supplies onto node 914. The bias stage can hold the DC voltage of node 914 at a $V_{bias}$.

As one non-limiting example, the transistor 1020 may have a width/length of 0.22/0.12 microns. During times when the transistor 1010 is on, Vcc 430 (minus a negligible voltage drop) is effectively connected to the node 914, and accordingly, realtime differences (including resonance fluctuations) between Vcc 430 and Vss 440 are impressed across the n-type transistor 1020. Thus, supply resonance may be detected by an example n-type transistor 1020 (e.g., NMOS) device capacitor in the AC input stage 370. An AC input stage signal may be fed forward to the sensing stage 210'.

When the power supply is subject to stimulus at its resonant frequency, the voltage differential between Vcc and Vss can change at this resonant frequency, as illustrated in FIG. 5. When this voltage increases, the sensing device capacitor 1020 can ensure that a sensed node 914 voltage stays a fixed voltage away from Vss. Meanwhile the threshold of the sense stage is a fixed proportion of the voltage difference between Vcc and Vss. The result in the example embodiment is that while the sensed node voltage 914 is normally slightly above the threshold of the sensing stage, a significant increase in the difference between Vcc and Vss can cause this sensed voltage to drop below the threshold of the sensing stage.

While the example AC input stage shows a specific example arrangement, practice of embodiments of the present invention is by no means limited thereto, and any viable type of AC input stage may be used.

In advancing a block rightward, sensing stage 210' may take an input from an AC input stage 370 and provide an output when resonance is sensed and targeted to be subsequently dumped by the charge dumper stage 220' (e.g., after optional amplification of such signal). As to an example construction, sensing stage 210' may include multiple 410 bias stage p-type transistors 1110, 1112, and multiple 420 bias stage n-type transistors 1118, 1120, electrically coupled between Vcc 430 and Vss 440. In the FIG. 4 example (advantageous) embodiment, the transistors of the bias stage 350 and sensing stages 210' may be electrically matched copies of each other.

The sensing stage has the ability to act as an inverter with a logic threshold that can be slightly below that of static voltage generated by the bias stage. This example threshold can ensure that under quiescent conditions the charge dumping stage 520 is OFF. The presence of devices 1112 and 1118 is just to match the ENABLEs in the bias stage. The devices 1110 and 1120 can be slightly different sized than devices 810 and 820 in order to have a voltage difference between Vbias and the logic threshold of the sensing stage.

That is, the width of the bias stage p-type transistors 1110, 1112 may be greater than the width of the sensing stage n-type transistors 1118, 1120 (e.g., twice the width, three times the width, etc.). As one non-limiting example, the transistors 1110, 1112 may each have a width/length of 0.66/0.12 microns, while the transistors 1118, 1120 may each have a width/length of 0.22/0.12 microns. The transistors 1110, 1120 may have gates thereof connected to receive feed forwarding of signals on node 914. Further, a gate of transistor 1112 may be connected to Vss 440, while a gate of transistor 1118 may be connected to Vcc 430. The sensing stage 210' may be used to output a sensed resonance signal. The sensed resonance signal on a node 1114 is fed forward to the amplification stage 330.

While the example sensing stage shows a specific example arrangement, practice of embodiments of the present invention is by no means limited thereto, and any viable type of sensing stage may be used. In alternate embodiments, the sense capacitor does not need to be built from an NMOS device, but can be built using a polysilicon or metal capacitor, or even a PMOS device. In addition, alternately the logic polarities can be reversed and the sense capacitor could connect to Vcc instead of Vss.

Turning next to the amplification stage 330, such stage may be optionally inserted between a sensing stage 210' and a charge dumper stage 220'. As one example, the stage 330 may have a first set of transistors 610, 620 connected in series across Vcc 430 and Vss 440 (and acting as an inverter stage), and may have gates thereof connected to receive feed forwarding of for the sensed resonance signals on node 1114. The stage 330 may also have a second set of transistors 630, 640 connected in series across Vcc 430 and Vss 440 (and acting as an inverter stage), and may have gates thereof connected to receive feed forwarding of the amplified signals on node 1214, and may output an ultimate amplified signal on node 1314.

The amplification stage can serve to isolate the sensing stage from the capacitance of the charge dump stage. It can also set an upper frequency limit to which the circuit will respond e.g., this frequency limit imposed by modulating the sizes of devices 610, 620, 630, and 640. In an example embodiment, the ratio of devices 610/620 can be made larger than a nominal inverter i.e. having an example ratio of approximately 2/1), while the ratio of 630/640 can be smaller than that of a typical inverter. This can result in a high threshold for inverter 610/620 and a low threshold for inverter 630/640.

Since $V_{bias}$ is above the threshold of the sensing stage, the output of the sensing stage can be normally low. In order to dump charge it must pull node 1114 above the high threshold of 610/620 which must in turn pull 1214 below the low threshold of 630/640. In order to turn the charge dump off, the sensing stage must pull node 1114 below the high threshold of 610/620, which must in turn pull node 1214 above the low threshold of 630/640. It can readily be seen by one of ordinary skill in the art that it takes more time for the sensing stage to turn the charge dump on than to turn it off, and thus at very high frequencies the turning-on event will be overtaken by a subsequent turning-off event before the charge dump is ever activated. This prevents the circuit from responding to noise that occurs at frequencies much higher than the package resonance. Responding to such noise would waste power and potentially lead to unstable operation. As is the case with the lower frequency limit, there is a large frequency range in which this upper frequency limit can be placed.

An example transistor 610 of the first inverter stage coupled to sensing stage 210' may be skewed with an example large amplification stage p-type transistor, and transistors of an example last inverter stage coupled to a charge dumper stage 220' may contain large amplification stage transistors. That is, in an example embodiment, the width of the amplification stage p-type transistor 610 coupled to the sensing stage may be greater than the width of the amplification stage transistors 630, 640 (e.g., seven times the width, eight times the width, nine times the width, etc.). As one non-limiting example, the transistor 610 may have a width/length of 2/0.12 microns, the transistor 620 may have a width/length of 0.22/0.12 microns, and the transistors 630, 640 may each have a width/length of 0.3/0.12 microns.

While the example amplification stage shows a specific example arrangement, practice of embodiments of the present invention is by no means limited thereto, and any viable type of amplification stage may be used. For example, a differing number of inverter stages may be used.

Turning next to an example final stage, the largest device in the circuit is a dump device, which is used to pull Vcc and Vss together when they get too far apart. Connections to this device need to be robust to tolerate the potentially large currents that are used to accomplish this objective. Drawing this device with longer than nominal gate length may help in this regard. A charge dumper stage 220' may dump a charge from Vcc to Vss when the power system has extra charges or energy, which reduces resonance energy and amplitude. Such example stage may contain a plurality of example charge dumper stage n-type transistors 520 electrically coupled between Vcc 430 and Vss 440, and have any gate thereof controlled by the amplified sense signal feed forwarded from the amplification stage 330 via the node 1314. The transistor(s) 520 may have an example width that may be greater than a width of other transistors in other stages, and as one non-limiting example, may have a width/length of 40/0.12 microns. Such charge dumper (i.e., wasting) stage 220' may receive sensing information of a resonance present, and upon receiving such, may dump (i.e., waste) predetermined charges by allowing the charges to bleed through the transistor(s) 520 from Vcc 430 and Vss 440. That is, the charges may be wasted instead of being stored within capacitors.

Since this device directly bridges the power supply rails together, it may also be preferable to use a PMOS device in order to better tolerate the transients that occur during a electrostatic discharge event. In this case an extra inverting stage could be added to the amplification stage (for an example total of three), inverting the quiescent polarity of the signal appearing on the gate of the dump device 520.

The example topology shown in the example FIGS. 2–4 permits individual component values to be adjustable so as to adapt with process technology advances. As but one non-limiting example, the bandwidth adjustment stage 360 components may be re-adjusted to match any present IC process technology, while at the same time, to match relatively stagnant package technology. As another example, the charge dumper stage 220' may be adjusted to handle more current for any higher power die. As yet another example, all the lengths of transistor-like devices (except for the dumping transistor 520) in an IC resonance reduction circuit 300 may be able to be made to be approximately identical to one another.

FIG. 5 illustrates example voltage waveforms results 500 from resonance reduction of Vcc/Vss power grid connections with an example embodiment of the present invention, such view being useful in gaining a more thorough understanding/appreciation of the present invention. The horizontal direction shows time, whereas the four differing horizontal axes show vertically represent differing example die voltage levels, i.e., 0.0V, 0.4V, 0.8V and 1.2V. The vertical axis shown represents an example arbitrary time labeled as t=ON. The top voltage waveform 505A/505B illustrates an example Vcc on-die voltage, whereas the bottom waveform 510A/510B illustrates an example Vss on-die voltage.

The example waveforms 505B/510B shown to the left of the vertical axis t=ON represent Vcc/Vss voltage levels BEFORE an example resonance reduction embodiment of the present invention is enabled, and the example waveforms 505A/510A shown to the right of the vertical axis t=ON represent Vcc/Vss voltage levels AFTER an example resonance reduction embodiment of the present invention is enabled. FIG. 5 shows a short initial transitory period immediately after t=ON enablement of resonance reduction circuit, followed by waveforms 505A/510A having, for example, a 50% reduction in resonance over the prior waveforms 505B/510B.

In beginning to conclude, the CPU executes programs while operating at some frequency, with each program executing a sequence of operations, and with each operation requiring some amount of power drawn over some number of CPU cycles. In particular, some operations can draw a lot of power, others very little. For example, a program that alternates high and low power instructions can stimulate a power supply network at an example approximate half of the CPU operating frequency, while a program that executes a pair of high power instructions followed by a pair of low power instructions repeatedly can stimulate the power supply network at an example approximate quarter of the CPU operating frequency. In general while it is difficult to classify instructions as being high or low power, the CPU needs to operate correctly for all meaningful combinations of instructions. If the difference between a Vcc and Vss becomes too small for too long a time period the CPU will no longer be able to deliver correct results at its rated operating frequency. The power supply noise that can be experienced by any single processor may thus change every time a new program (or even an old program with new data) is run. Consequently, advantageous embodiments of the present invention may be arranged to be reactive over a broad range, and thus adaptive to technological advances.

This example (advantageous) embodiment may reduce resonance amplitude and address the problem of on-die power supply voltage loss induced by package resonance, and further utilize less on-die decoupling capacitance and on-die switched capacitors than the disadvantageous embodiments so less leakage current may be induced. Further, such an advantageous embodiment may also have minimal droop impact as compared to an embodiment that increases the series resistance of package capacitance. Although the example (advantageous) embodiment may be dissipating (i.e., wasting) energy, this dissipation may occur when energy is not desired, thereby, improving the voltage seen at a desired part of the circuit at a desired point in time. This may be more effective than a disadvantageous random saving of energy.

At least a portion(s) of the present invention may be practiced as a software invention, implemented in the form of a machine-readable medium having stored thereon at least one sequence of instructions that, when executed, causes a machine to effect operations or construct circuits with respect to the invention. With respect to the term "machine", such term should be construed broadly as encompassing all types of machines, e.g., a non-exhaustive listing including: computing machines, non-computing machines, communication machines, etc. A "machine-readable medium" includes any mechanism that provides (i.e., stores and/or transmits) information in a form readable by a machine (e.g., a processor, computer, electronic device). Such "machine-readable medium" term should be broadly interpreted as encompassing a broad spectrum of mediums, e.g., a non-exhaustive listing including: electronic medium (read-only memories (ROM), random access memories (RAM), flash cards); magnetic medium (floppy disks, hard disks, magnetic tape, etc.); optical medium (CD-ROMs, DVD-ROMs, etc); electrical, optical, acoustical or other form of propagated signals (e.g., carrier waves, infrared signals, digital signals); etc.

Embodiments within a scope of the present invention include simplistic level embodiments through system levels embodiments. For example, a resonance reduction circuit which may be implemented as its own discrete integrated circuit (IC) embodiment, may likewise be implemented as any of: part of a chip or chipset embodiment; part of a chip or chipset embodied on a printed circuit board (e.g., motherboard) embodiment; part of a chip or chipset of an electronic device such as a computing device (e.g., personal computer (PC), server), non-computing device (e.g., communications) device; part of machinery embodiment (e.g., automotive) containing the electronic device.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment or component, it is submitted that it is within the purview of one skilled in the art to effect such feature, structure, or characteristic in connection with other ones of the embodiments or components. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

Although the present invention has been described with reference to a number of illustrative embodiments thereof, it should be understood that numerous other modifications and embodiments may be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, the advantageous method and circuit for reducing resonance including sensing resonance and dumping charges may be utilized in an electrical environment removed from incorporation within a die. Additionally, the resonance reduction circuit may be alternatively designed as a discrete component and added to a system in place of other discrete resonance components (e.g., decoupling capacitors). It is also mentioned that electrical component devices within a resonance reduction circuit do not necessarily need to be sized the same as state-of-the art minimum sized devices that are presently available in the art (e.g., processor technology). For example, a sizing of the resonance reduction component devices may instead track package technology sizing.

What is claimed is:

1. A resonance reduction circuit comprising:
   a resonance sensor to detect for predetermined resonance at a circuit location; and
   a charge dumper to dump charges at least one of from and to the circuit location upon detection of the predetermined resonance by the resonance sensor, the charge dumper comprising at least one gating transistor to dump the charges, the at least one gating transistor directly connected to a first power supply line having a first potential and a second power supply line having a second potential of a different potential than the first potential.

2. A resonance reduction circuit as claimed in claim 1, wherein the resonance reduction circuit is an on-die integrated circuit (IC).

3. A resonance reduction circuit as claimed in claim 1, wherein the resonance reduction circuit is part of an integrated circuit (IC) package, and wherein the predetermined resonance pertains to a predetermined IC package resonance.

4. A resonance reduction circuit as claimed in claim 1, wherein the resonance sensor is a power grid resonance sensor to detect for predetermined resonance of a power grid.

5. An integrated circuit (IC) comprising:
   a resonance reduction circuit including:
      a resonance sensor to detect for predetermined resonance at a circuit location; and
      a charge dumper to dump charges at least one of from and to the circuit location upon detection of the predetermined resonance by the resonance sensor, the charge dumper comprising at least one gating transistor to dump the charges, the at least one gating transistor directly connected to a first power supply line having a first potential and a second power supply line having a second potential of a different potential than the first potential.

6. An IC as claimed in claim 5, wherein the resonance reduction circuit is part of a monolithic on-die circuit.

7. An IC as claimed in claim 5, wherein the resonance reduction circuit is an IC on an IC package, and wherein the predetermined resonance pertains to a predetermined IC package resonance.

8. An IC as claimed in claim 5, wherein the resonance sensor is a power grid resonance sensor to detect for predetermined resonance of a power grid.

9. An electronic package comprising:
a die; and
a resonance reduction circuit including:
    a resonance sensor to detect for predetermined resonance at a circuit location of the electronic package; and
    a charge dumper to dump charges at least one of from and to the circuit location upon detection of the predetermined resonance by the resonance sensor, the charge dumper comprising at least one gating transistor to dump the charges, the at least one gating transistor directly connected to a first power supply line having a first potential and a second power supply line having a second potential of a different potential than the first potential.

10. An electronic package as claimed in claim 9, wherein the resonance reduction circuit is an on-die circuit.

11. An electronic package as claimed in claim 9, wherein the resonance reduction circuit is part of an IC on the electronic package, and wherein the predetermined resonance pertains to a predetermined electronic package resonance.

12. An electronic package as claimed in claim 9, wherein the resonance sensor is a power grid resonance sensor to detect for predetermined resonance of a power grid.

13. A system comprising:
at least one item selected from a list of: an electronic package, PCB, socket, bus portion, input device, output device, power supply arrangement and case; and
a resonance reduction circuit including:
    a resonance sensor to detect for predetermined resonance at a circuit location; and
    a charge dumper to dump charges at least one of from and to the circuit location upon detection of the predetermined resonance by the resonance sensor, the charge dumper comprising at least one gating transistor to dump the charges, the at least one gating transistor directly connected to a first power supply line having a first potential and a second power supply line having a second potential of a different potential than the first potential.

14. A system as claimed in claim 13, wherein the resonance reduction circuit is an on-die circuit.

15. A system as claimed in claim 13, wherein the resonance reduction circuit is part of an IC of an electronic package, and wherein the predetermined resonance pertains to a predetermined electronic package resonance.

16. A system as claimed in claim 13, wherein the resonance sensor is a power grid resonance sensor to detect for predetermined resonance of a power grid.

17. A resonance reduction method comprising:
detecting for predetermined resonance at a circuit location; and
dumping charges at least one of from and to the circuit location upon detection of the predetermined resonance by using at least one gating transistor, the at least one gating transistor directly connected to a first power supply line having a first potential and a second power supply line having a second potential of a different potential than the first potential.

18. A resonance reduction method as claimed in claim 17, wherein the resonance reduction method is implemented by an on-die integrated circuit (IC).

19. A resonance reduction method as claimed in claim 17, wherein the resonance reduction method is implemented by part of an integrated circuit (IC) package, and wherein the predetermined resonance pertains to a predetermined IC package resonance.

20. A resonance reduction method as claimed in claim 17, wherein the detecting detects for predetermined resonance of a power grid, and wherein the dumping uses at least one gating transistor to dump the charges between a first power grid connection and a second power grid connection of a differing potential than the first power grid connection.

21. A method for reducing resonance comprising:
sensing resonance;
providing a signal to a charge dissipation stage when resonance is sensed; recognizing the signal; and
dissipating charges from a first potential to a second potential where the second potential is lower than the first potential with at least one gating transistor, the at least one gating transistor directly connected to a first power supply line having a first potential and a second power supply line having a second potential of a different potential than the first potential.

22. A mounted electrical component arrangement comprising:
a plurality of electrical components; and
a circuit to reduce power supply package resonance mounted to a substrate within at least one of the electrical components, with the circuit including a sensing stage to detect resonance and a current dissipation stage to dump charges from a first potential to a second potential where the second potential is lower than the first potential, the current dissipation stage comprising at least one gating transistor to dump the charges, the at least one gating transistor directly connected to a first power supply line having a first potential and a second power supply line having a second potential of a different potential than the first potential.

* * * * *